(12) United States Patent
Cho

(10) Patent No.: US 9,287,421 B2
(45) Date of Patent: Mar. 15, 2016

(54) SOLAR CELL MODULE AND METHOD OF FABRICATING THE SAME

(71) Applicant: LG INNOTEK CO., LTD., Seoul (KR)

(72) Inventor: Ho Gun Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/361,227

(22) PCT Filed: Nov. 26, 2012

(86) PCT No.: PCT/KR2012/010053
§ 371 (c)(1),
(2) Date: May 28, 2014

(87) PCT Pub. No.: WO2013/081346
PCT Pub. Date: Jun. 6, 2013

(65) Prior Publication Data
US 2014/0332051 A1    Nov. 13, 2014

(30) Foreign Application Priority Data
Nov. 29, 2011    (KR) .......................... 10-2011-0126236

(51) Int. Cl.
*H01L 31/042* (2014.01)
*H02N 6/00* (2006.01)
*H01L 31/0224* (2006.01)
*H01L 31/0216* (2014.01)
*H01L 31/0749* (2012.01)
*H01L 31/046* (2014.01)

(52) U.S. Cl.
CPC .. *H01L 31/022425* (2013.01); *H01L 31/02167* (2013.01); *H01L 31/046* (2014.12); *H01L 31/0749* (2013.01); *Y02E 10/541* (2013.01)

(58) Field of Classification Search
CPC .............. H01L 31/046; H01L 31/0465; H01L 31/0468; H01L 31/0463
See application file for complete search history.

(56) References Cited

U.S. PATENT DOCUMENTS

2002/0089634 A1* 7/2002 Aruga et al. ................... 349/149
2009/0090413 A1* 4/2009 Katsoulis et al. .............. 136/260
2011/0197967 A1   8/2011 Kaijo et al.

FOREIGN PATENT DOCUMENTS

JP   2011-023622 A      2/2011
JP      2011023622 A  *  2/2011
KR  10-2011-0043358 A   4/2011

OTHER PUBLICATIONS

International Search Report in International Application No. PCT/KR2012/010053, filed Nov. 26, 2012.

* cited by examiner

*Primary Examiner* — Eli Mekhlin
(74) *Attorney, Agent, or Firm* — Saliwanchik, Lloyd & Eisenschenk

(57) ABSTRACT

Disclosed are a solar cell module and a method of fabricating the same. The solar cell module includes a support substrate and a plurality of solar cells on the support substrate. Each of the solar cells includes a back electrode layer on the support substrate; a light absorbing layer on the back electrode layer; a buffer layer on the light absorbing layer; a conductive layer on the buffer layer; and a front electrode layer on the conductive layer.

10 Claims, 2 Drawing Sheets

SOLAR CELL MODULE AND METHOD OF FABRICATING THE SAME

CROSS-REFERENCE TO RELATED APPLICATIONS

This application is the U.S. national stage application of International Patent Application No. PCT/KR2012/010053, filed Nov. 26, 2012, which claims priority to Korean Application No. 10-2011-0126236, filed Nov. 29, 2011, the disclosures of each of which are incorporated herein by reference in their entirety.

TECHNICAL FIELD

The embodiment relates to a solar cell module and a method of fabricating the same.

BACKGROUND ART

Recently, the development of new renewable energy has become more important and interested due to the serious environmental pollution and the lack of fossil fuel. Among the new renewable energy, a solar cell is spotlighted as a pollution-free energy source for solving the future energy problem because it rarely causes environmental pollution and has the semi-permanent life span and there exists infinite resources for the solar cell.

Solar cells may be defined as devices to convert light energy into electrical energy by using a photovoltaic effect of generating electrons when light is incident onto a P-N junction diode. The solar cell may be classified into a silicon solar cell, a compound semiconductor solar cell mainly including a group I-III-VI compound or a group III-V compound, a dye-sensitized solar cell, and an organic solar cell according to materials constituting the junction diode.

A solar cell made from CIGS (CuInGaSe), which is one of group I-III-VI Chal-copyrite-based compound semiconductors, represents superior light absorption, higher photoelectric conversion efficiency with a thin thickness, and superior electro-optic stability, so the CIGS solar cell is spotlighted as a substitute for a conventional silicon solar cell.

In general, a CIGS solar cell can be prepared by sequentially forming a back electrode layer, a light absorbing layer and a front electrode layer on a glass substrate. Meanwhile, according to the related art, doped zinc oxide (AZO) used for the front electrode is thickly deposited under lower power to reduce resistance, so the light transmittance may be lowered, the process may be unstable, the material cost may be increased and the facility investment cost may be increased. In addition, serial resistance Rs of the front electrode may be increased as the width of the solar cell is enlarged, so that the electric conductivity may be lowered.

DISCLOSURE OF INVENTION

Technical Problem

The embodiment provides a solar cell module having the improved electron collection capability and photoelectric conversion efficiency and a method of fabricating the same.

Solution to Problem

According to the embodiment, there is provided a solar cell module including a support substrate and a plurality of solar cells on the support substrate. Each of the solar cells includes a back electrode layer on the support substrate; a light absorbing layer on the back electrode layer; a buffer layer on the light absorbing layer; a conductive layer on the buffer layer; and a front electrode layer on the conductive layer.

According to the embodiment, there is provided a method of fabricating a solar cell module including forming a back electrode layer on a support substrate; forming a light absorbing layer on the back electrode layer; forming a buffer layer on the light absorbing layer; forming a conductive layer on the buffer layer; and forming a front electrode layer on the conductive layer.

Advantageous Effects of Invention

According to the solar cell module of the embodiment, the conductive layer having the electric property superior to that of the front electrode layer can be formed, so that a greater amount of the electrons generated from the light absorbing layer can be collected. Therefore, the photoelectric conversion efficiency of the solar cell module according to the embodiment can be improved.

According to the embodiment, the front electrode layer can be fabricated in a thinner thickness as compared with that of the related art due to the conductive layer, so the light transmittance of the solar cell according to the embodiment can be improved. In addition, since the thickness of the front electrode layer can be reduced, the manufacturing cost for the solar cell can be reduced.

MODE FOR THE INVENTION

Figure 1:
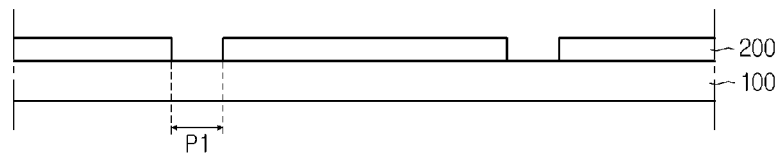
FIGS. 1 to 7 are sectional views showing a method of fabricating a solar cell module according to the embodiment.

In the description of the embodiments, it will be understood that, when a substrate, a layer, a film, or an electrode is referred to as being "on" or "under" another substrate, another layer, another film, or another electrode, it can be "directly" or "indirectly" on the other substrate, the other layer, the other film, or the other electrode, or one or more intervening layers may also be present. Such a position of each component has been described with reference to the drawings. The thickness and size of each component shown in the drawings may be exaggerated, omitted or schematically drawn for the purpose of convenience or clarity. In addition, the size of elements does not utterly reflect an actual size.

FIGS. 1 to 7 are sectional views showing a method of fabricating a solar cell module according to the embodiment. Hereinafter, the solar cell module and the method of fabricating the same according to the embodiment will be described in detail with reference to FIGS. 1 to 7.

Referring to FIG. 1, a back electrode layer 200 is formed on a support substrate 100.

The support substrate 100 has a plate shape and supports the back electrode layer 200, a light absorbing layer 300, a buffer layer 400, a high-resistance buffer layer 500, a conductive layer 600 and a front electrode layer 700.

The support substrate 100 may be transparent, and rigid or flexible. The support substrate 100 may be an insulator. For example, the support substrate 100 may be a glass substrate, a plastic substrate or a metal substrate. In detail, the support substrate 100 may be a soda lime glass substrate.

In addition, the support substrate 100 may include a ceramic substrate, such as alumina, stainless steel, or polymer having a flexible property.

The back electrode layer 200 may include at least one of molybdenum (Mo), gold (Au), aluminum (Al), chrome (Cr), tungsten (W), and copper (Cu). Among the above materials, the Mo has a thermal expansion coefficient similar to that of the support substrate 100, so the Mo may improve the adhesive property and prevent the back electrode layer 200 from being delaminated from the substrate 100. Further, the back electrode layer 200 may include two layers or more. The layers may be formed of the same material or different materials, respectively.

The back electrode layer 200 may be formed through PVD (physical vapor deposition) or plating. In addition, an additional layer, such as a diffusion barrier layer, may be interposed between the support substrate 100 and the back electrode layer 200.

The back electrode layer 200 may be patterned by a first division pattern P1. In addition, the first division pattern P1 may have various shapes, such as a stripe shape as shown in FIG. 1 and a matrix shape.

Figure 2:
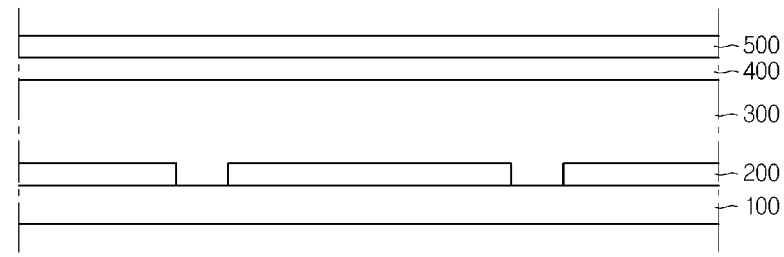

Referring to FIG. 2, the light absorbing layer 300, the buffer layer 400 and the high-resistance buffer layer 500 are sequentially formed on the back electrode layer 200.

The light absorbing layer 300 may be formed through various schemes such as a scheme of forming a Cu(In,Ga)Se$_2$ (CIGS) based light absorbing layer 300 by simultaneously or separately evaporating Cu, In, Ga, and Se and a scheme of performing a selenization process after a metal precursor layer has been formed.

Regarding the details of the selenization process after the formation of the metal precursor layer, the metal precursor layer is formed on the back electrode layer 200 through a sputtering process employing a Cu target, an In target and a Ga target.

Then, the metal precursor layer is subject to the selenization process so that the Cu(In, Ga) Se$_2$ (CIGS) based light absorbing layer 300 is formed.

In addition, the sputtering process employing the Cu target, the In target, and the Ga target and the selenization process may be simultaneously performed.

Further, a CIS or a CIG based light absorbing layer 300 may be formed through the sputtering process employing only Cu and In targets or only Cu and Ga targets and the selenization process.

The buffer layer 400 is formed on the light absorbing layer 300. The buffer layer may include CdS, ZnS, In$_X$S$_Y$ or In$_X$Se$_Y$Zn(O,OH). The buffer layer 400 may have an energy bandgap of about 2.2 eV to about 2.4 eV. The buffer layer 400 may be formed by depositing the CdS on the light absorbing layer 300 through a CBD (Chemical Bath Deposition) scheme. The high-resistance buffer layer 500 is formed on the buffer layer 400. The high-resistance buffer layer 500 includes i-ZnO, which is not doped with impurities. The high-resistance buffer layer 500 may have an energy bandgap of about 3.1 eV to 3.3 eV. In addition, the high-resistance buffer layer 500 may be omitted. The high-resistance buffer layer 500 may be formed by depositing ZnO on the buffer layer 400 through the sputtering process.

Figure 3:
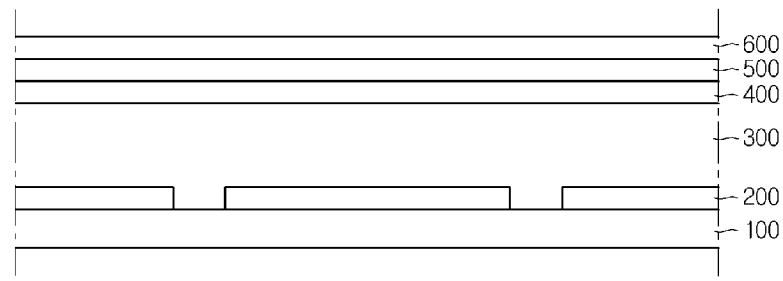
Figure 4:
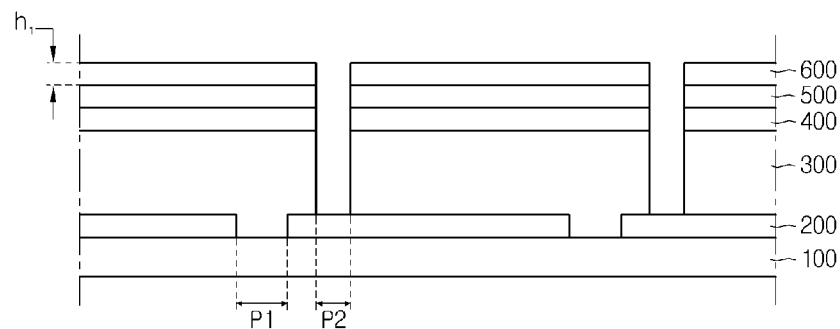
Figure 5:
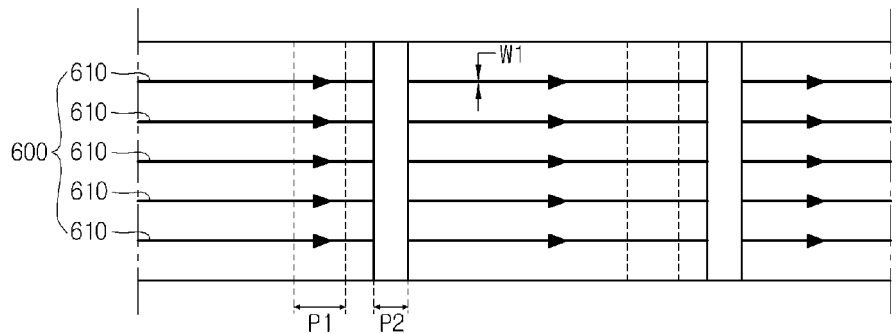

Referring to FIGS. 3 to 5, the conductive layer 600 is formed on the high-resistance buffer layer 500 and a second division pattern P2 is formed through the light absorbing layer 300, the buffer layer 400, the high-resistance buffer layer 500 and the conductive layer 600.

First, the conductive layer 600 is formed on the high-resistance buffer layer 500. The conductive layer 600 may include a plurality of conductive wires 610. The conductive wires 610 may be spaced apart from each other at a regular interval as shown in FIGS. 3 to 5, but the embodiment is not limited thereto. For instance, the conductive wires 610 can be spaced apart from each other at an irregular interval.

The conductive wires 610 are formed of conductive materials. The conductive wires 610 extend in parallel to the charge transfer direction in the front electrode layer 700. Thus, the conductive wires 610 may improve the mobility of the charges in the front electrode layer 700. In addition, the conductive wires 610 may improve the mobility of the charges from the light absorbing layer 300 to the outside, that is, to the front electrode layer 700. Therefore, the conductive wires 610 may improve the conductivity of the front electrode layer 700. In order to perform the above functions, the conductive wires 610 may have the higher electric conductivity and lower specific resistance as compared with those of the front electrode layer 700.

For instance, the conductive wires 610 may include at least one of silver (Ag), aluminum (Al), calcium (Ca), chrome (Cr), iron (Fe), cobalt (Co), nickel (Ni), copper (Cu), molybdenum (Mo), ruthenium (Ru), indium (In) and tungsten (W). In detail, the conductive wires 610 may include only one of the Ag, Al and Cu, but the embodiment is not limited thereto.

Each conductive wire 610 may have a thickness h1 in the range of about 50 nm to about 100 nm. In addition, each conductive wire 610 may have a width w1 in the range of about 1 nm to about 30 nm. That is, the conductive wires 610 may be fabricated to have a nanometer size. The conductive wires 610 having the nano size may allow the light incident into the solar cell module to transmit through the solar cell without reflecting or blocking the incident light.

In addition, the conductive wires 610 can minimize current loss and reduce the thickness of the front electrode layer 700. That is, since the conductive wires 610 having the superior electric conductivity are used as electrodes, the front electrode layer 700 can be fabricated with a thinner thickness. For instance, the thickness of the front electrode layer 700 according to the embodiment can be reduced by about 30% to about 50% as compared with the thickness of the front electrode layer according to the related art, but the embodiment is not limited thereto. Thus, the solar cell according to the embodiment may have the improved light transmittance and may increase the short-circuit density (Jsc) so that the photoelectric conversion efficiency of the solar cell can be improved.

After the conductive layer 600 has been formed on the high-resistance buffer layer 500, the second division pattern P2 is formed through the light absorbing layer 300, the buffer layer 400, the high-resistance buffer layer 500 and the conductive layer 600.

The second division pattern P2 can be formed through the mechanical scheme or the laser irradiation scheme. Due to the second division pattern P2, the back electrode layer 200 is partially exposed.

Figure 6:
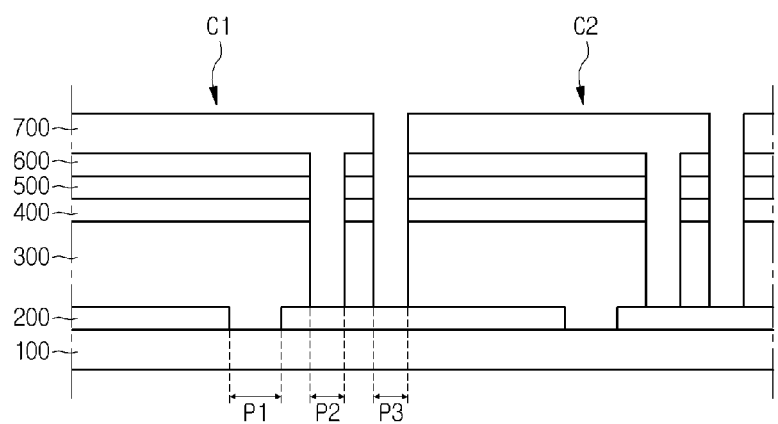
Figure 7:
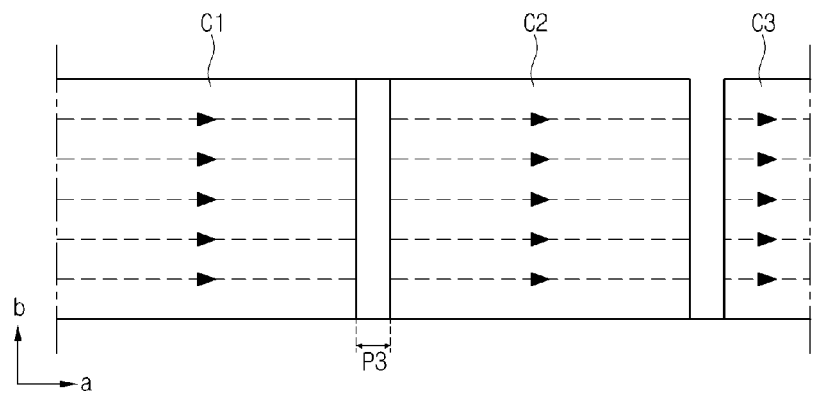

Referring to FIGS. 6 and 7, the front electrode layer 700 is formed on the conductive layer 600. The front electrode layer 700 is electrically connected to the back electrode layer 200 through the second division pattern P2.

The front electrode layer 700 may be formed of a transparent conductive material. In addition, the front electrode layer 700 may have characteristics of an N type semiconductor. The front electrode layer 700 forms an N type semiconductor layer together with the buffer layer 400 to form the PN junction in corporation with the light absorbing layer 300 serving as a P type semiconductor layer. For instance, the front electrode layer 700 may include aluminum doped zinc oxide (AZO).

As described above, the thickness of the front electrode layer 700 according to the embodiment can be reduced by about 30% to about 50% as compared with thickness of the front electrode layer according to the related art. For instance, the thickness of the front electrode layer 700 may be in the range of about 100 nm to about 500 nm, but the embodiment is not limited thereto.

The front electrode layer 700 can be formed by laminating a transparent conductive material on the conductive layer 600. The transparent conductive material may include zinc oxide doped with aluminum or boron. The process for forming the front electrode layer 700 can be perform under the temperature in the range of the normal temperature to about 300° C. For instance, the front electrode layer 700 can be formed through the sputtering or chemical vapor deposition. In more detail, in order to form the front electrode layer 700 through the sputtering, an RF sputtering process may be performed by using a ZnO target or a reactive sputtering process may be performed by using a Zn target.

Then, a third division pattern P3 is formed through the front electrode layer 700. The third division pattern P3 may be formed through the conductive layer 600, the high-resistance buffer layer 500, the buffer layer 400 and the light absorbing layer 300 as well as the front electrode layer 700. The solar cell module according to the embodiment may be defined as a plurality of solar cells C1, C2, C3 ... and Cn due to the third division pattern P3. The third division pattern P3 can be formed through the mechanical scheme or the laser irradiation scheme such that the top surface of the back electrode layer 200 can be exposed.

Referring to FIG. 7, the charge transfer is performed in the first direction among the solar cells C1, C2, C3 ... and Cn. In addition, the conductive wires 610 extend in the first direction a along the charge transfer direction. The conductive wires 610 may extend in the direction different from the extension direction of the solar cells C1, C2, C3 ... and Cn. For instance, the conductive wires 610 may extend in the first direction and the solar cells C1, C2, C3 ... and Cn may extend in the second direction b. The first direction a may be perpendicular to the second direction a, but the embodiment is not limited thereto.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell module comprising:
a support substrate; and
a plurality of solar cells on the support substrate,
wherein each of the solar cells comprises:
a back electrode layer on the support substrate;
a light absorbing layer on the back electrode layer;
a buffer layer on the light absorbing layer;
a conductive layer on the buffer layer;
a front electrode layer on the conductive layer;
a first division pattern formed through the back electrode layer;
a second division pattern formed through the light absorbing layer, the buffer layer, and the conductive layer; and
a third division pattern formed through the light absorbing layer, the buffer layer, the conductive layer, and the front electrode layer;
wherein the conductive layer includes a plurality of conductive wires extending among the solar cells in a first direction parallel to a charge transfer direction, and
wherein each of the conductive wires has a width in a range of about 1 nm to about 30 nm.

2. The solar cell module of claim 1, wherein the conductive wires include at least one of silver (Ag), aluminum (Al), calcium (Ca), chrome (Cr), iron (Fe), cobalt (Co), nickel (Ni), copper (Cu), molybdenum (Mo), ruthenium (Ru), indium (In), and tungsten (W).

3. The solar cell module of claim 1, wherein the solar cells extend in a second direction perpendicular to the first direction, respectively.

4. The solar cell module of claim 1, wherein each of the conductive wires has a thickness in a range of 50 nm to 100 nm.

5. The solar cell module of claim 1, wherein the front electrode layer is electrically connected to the back electrode layer through the second division pattern.

6. The solar cell module of claim 1, wherein the conductive wires are spaced apart from each other at a regular interval.

7. The solar cell module of claim 1, wherein the conductive wires are spaced apart from each other at an irregular interval.

8. The solar cell module of claim 1, wherein the conductive wires have higher electric conductivity and lower specific resistance as compared with those of the front electrode layer.

9. The solar cell module of claim 1, wherein the conductive wires include only one of Ag, Al, and Cu.

10. The solar cell module of claim 1, wherein a thickness of the front electrode layer is in a range of about 100 nm to about 500 nm.

* * * * *